(12) United States Patent
Kim et al.

(10) Patent No.: US 9,653,562 B2
(45) Date of Patent: May 16, 2017

(54) NONVOLATILE MEMORY DEVICE AND METHOD FOR MANUFACTURING THE SAME

(71) Applicant: SK hynix Inc., Gyeonggi-do (KR)

(72) Inventors: Jin-Ho Kim, Gyeonggi-do (KR); Sung-Lae Oh, Chungsheongbuk-do (KR); Chang-Man Son, Gyeonggi-do (KR); Go-Hyun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/012,039

(22) Filed: Feb. 1, 2016

(65) Prior Publication Data

US 2017/0069731 A1 Mar. 9, 2017

(30) Foreign Application Priority Data

Sep. 4, 2015 (KR) .................. 10-2015-0125734

(51) Int. Cl.
*H01L 29/76* (2006.01)
*H01L 29/423* (2006.01)
*H01L 27/11556* (2017.01)
*H01L 27/11582* (2017.01)
*H01L 29/40* (2006.01)

(52) U.S. Cl.
CPC .. *H01L 29/42376* (2013.01); *H01L 27/11556* (2013.01); *H01L 27/11582* (2013.01); *H01L 29/401* (2013.01)

(58) Field of Classification Search
USPC ...... 257/314–326, E27.078, E29.3–E29.309, 257/255–266, E21.179–E21.182, 257/E21.209–E21.21, E21.422, E21.423, 257/E21.679–E21.694; 365/185, 9, 365/185.29, 185.18, 185.17
See application file for complete search history.

(56) References Cited

U.S. PATENT DOCUMENTS

| | | | |
|---|---|---|---|
| 2013/0126957 A1* | 5/2013 | Higashitani | H01L 27/11519 257/314 |
| 2013/0234234 A1* | 9/2013 | Yoo | H01L 29/66833 257/324 |
| 2014/0131783 A1 | 5/2014 | Lee et al. | |
| 2014/0226414 A1* | 8/2014 | Costa | G11C 16/3445 365/185.22 |

* cited by examiner

*Primary Examiner* — Tram H Nguyen
(74) *Attorney, Agent, or Firm* — IP & T Group LLP

(57) ABSTRACT

A nonvolatile memory device includes a pipe gate electrode layer formed over a substrate; a plurality of conductive layers stacked over the pipe gate electrode layer; source lines formed over an uppermost one of the conductive layers; first slits passing through the pipe gate electrode layer at positions overlapping with the source lines, and dividing the pipe gate electrode layer into a plurality of pipe gate electrodes, and second slits passing through the conductive layers at positions different from the first slits, and dividing the conductive layers into a plurality of memory blocks.

21 Claims, 17 Drawing Sheets

NONVOLATILE MEMORY DEVICE AND METHOD FOR MANUFACTURING THE SAME

CROSS-REFERENCE TO RELATED APPLICATION

The present application claims priority under 35 U.S.C. §119(a) to Korean Patent Application No. 10-2015-0125734 filed on Sep. 4, 2015, which is herein incorporated by reference in its entirety.

BACKGROUND

1. Technical Field

Various embodiments generally relate to semiconductor technology, and more particularly, to a nonvolatile memory device and a method for manufacturing the same.

2. Related Art

As efforts for improving a degree of integration of a nonvolatile memory device with a 2-dimensional structure in which memory cells are formed as a single layer on a substrate, reach a limit, a nonvolatile memory device with a 3-dimensional structure, in which memory cells are three-dimensionally arranged on a substrate to improve a degree of integration, has been suggested. Since the nonvolatile memory device with a 3-dimensional structure may efficiently use the area of the substrate, the degree of integration may be improved when compared with the memory cells which are arranged two-dimensionally. Also, since this technology is not based on a method of repeating a step of forming memory cells on a plane but memory cells are formed through blanket processing on a plurality of word lines which are vertically stacked, a manufacturing cost for a unit cell may be significantly decreased.

A nonvolatile memory device with a 3-dimensional structure generally includes a structure with a line type channel layer and a structure with a U-shaped channel layer. In the case of the structure with a U-shaped channel layer, pipe coupling transistors are used to couple memory cell strings.

In the nonvolatile memory device with a 3-dimensional structure, in order to divide stacked word lines into a plurality of memory blocks, slits are formed to pass through word lines. In an etching process for forming the slits, problems may be caused in that structures formed under gate electrodes of the pipe, coupling transistors hereinafter, referred to as "pipe gate electrodes", are likely to be damaged.

SUMMARY

In an embodiment, a nonvolatile memory device may include: a pipe gate electrode layer formed over a substrate; a plurality of conductive layers stacked over the pipe gate electrode layer; source lines formed over an uppermost one of the conductive layers; first slits passing through the pipe gate electrode layer at positions overlapping with the source lines, and dividing the pipe gate electrode layer into a plurality of pipe gate electrodes; and second slits passing through the conductive layers at positions different from the first slits, and dividing the conductive layers by the unit of memory block.

In an embodiment, a method for manufacturing a nonvolatile memory device may include: forming a pipe gate electrode layer over a substrate; etching the pipe gate electrode layer and forming first slits which divide the pipe gate electrode layer into a plurality of pipe gate electrodes; forming a first dielectric layer to fill the first slits alternately stacking a plurality of first material layers and a plurality of second material layers over the pipe gate electrodes and the first dielectric layer; etching the first and second material layers by using the pipe gate electrodes as an etch stop layer and forming second slits which divide the first and second material layers by the unit of memory block, at positions different from the first slits; forming a second dielectric layer to fill the second slits; and forming source lines to overlap with the first slits.

DETAILED DESCRIPTION

Hereinafter, a nonvolatile memory device and a method for manufacturing the same will be described below with reference to the accompanying drawings through various examples of embodiments.

Figure 1:
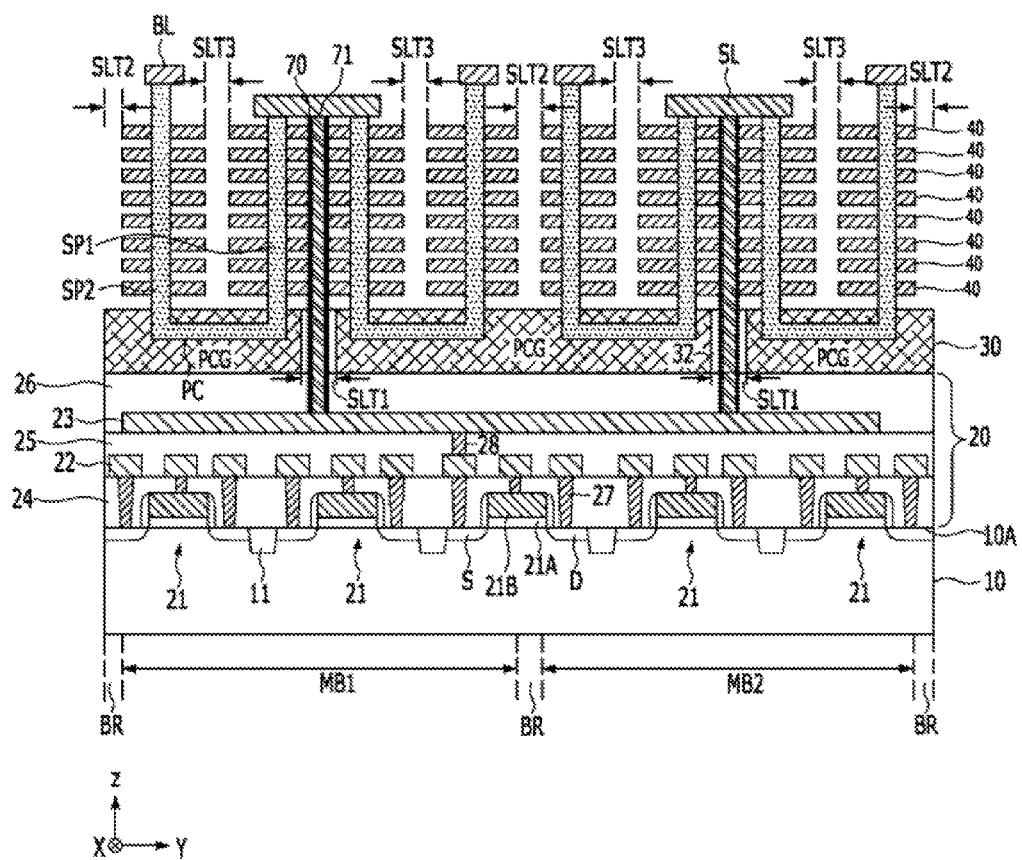
FIG. 1 is a cross-sectional view illustrating a nonvolatile memory device in accordance with an embodiment.
Figure 2:
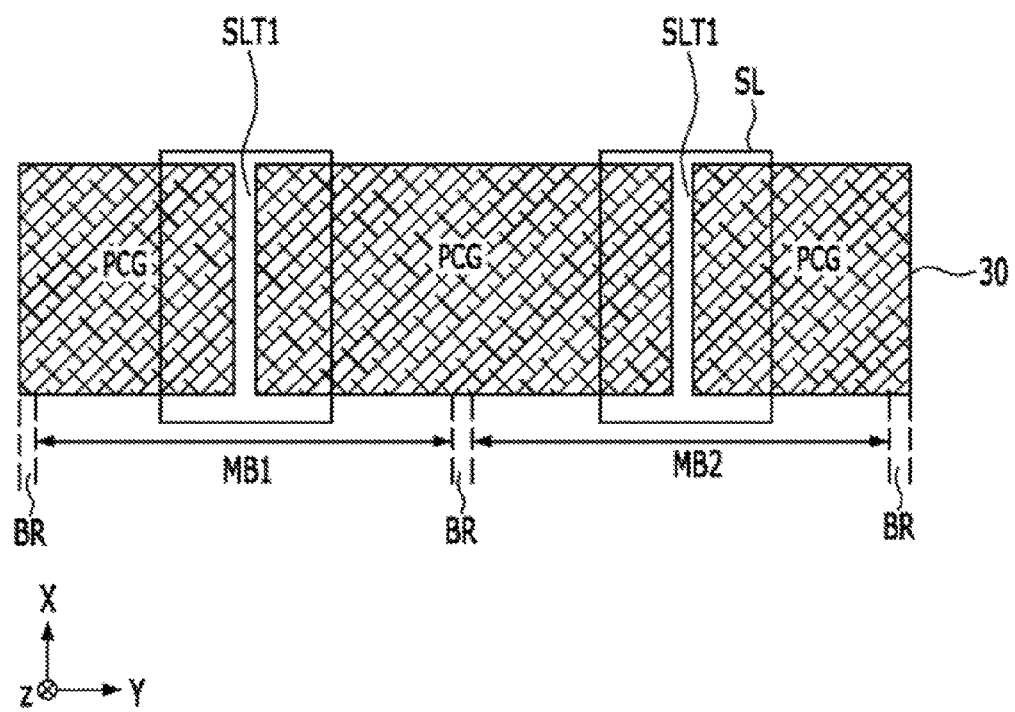
FIG. 2 is a plan view illustrating the pipe gage electrodes and the source lines shown in FIG. 1.
Figure 3:
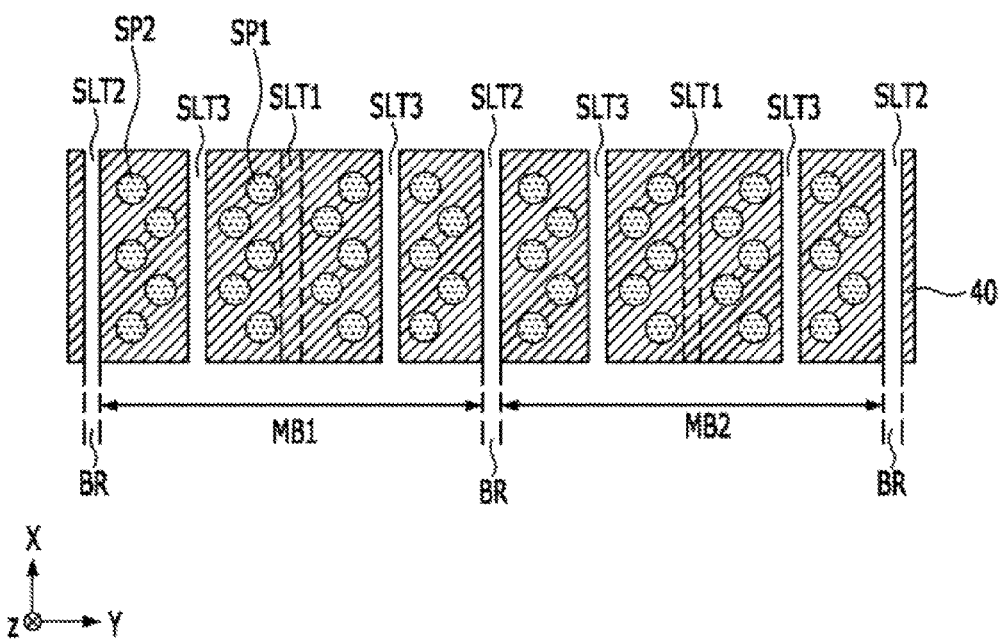
FIG. 3 is a plan view illustrating the conductive layer of FIG. 1.

FIG. 1 is a cross-sectional view illustrating a nonvolatile memory device in accordance with an embodiment, FIG. 2 is a plan view illustrating the pipe gage electrodes and the source lines shown in FIG. 1, and FIG. 3 is a plan view illustrating the conductive layer shown in FIG. 1.

Referring to FIG. 1, a nonvolatile memory device in accordance with an embodiment may include a substrate 10, a pipe gate electrode layer 30 which is formed on the substrate 10, a plurality of conductive layers 40 which are stacked on the pipe gate electrode layer 30, and to source lines SL which are formed on the uppermost conductive layer 40. The nonvolatile memory device in accordance with the embodiment may have first slits SLT1 and second slits SLT2. The first slits SLT1 pass through the pipe gate electrode layer 30 at positions overlapping with the source lines SL and divide the pipe gate electrode layer 30 into a plurality of pipe gate electrodes PCG. The second slits SLT2 pass through the conductive layers 40 at positions separated from the first slits SLT1 and divide the conductive layers 40 by unit of memory block.

In detail, the substrate 10 may be a silicon substrate, a germanium substrate, a silicon-germanium substrate, a silicon-on-insulator ("SOI") substrate, or a silicon-germanium-on-insulator ("SGOI") substrate, and may include a predetermined structure such as an isolation layer 11 which defines active regions.

A circuit layer 20 may be formed between the substrate 10 and the pipe gate electrode layer 30. The circuit layer 20 may include a peripheral circuit for driving memory cells and metal lines 22 and 23. The peripheral circuit may be an integrated circuit in which individual elements such as peripheral transistors 21, resistors, capacitors and fuses are electrically coupled with one another.

The peripheral transistors 21 of the peripheral circuit are shown in FIG. 1 as an example. Each of the peripheral transistors 21 may include a gate dielectric layer 21A, a gate electrode 21B, a source S and a drain D. The gate dielectric layer 21A may be formed of a silicon oxide layer. In another embodiment, the gate dielectric layer 21A may include a gate dielectric layer for a high voltage. In yet another embodiment, the gate dielectric layer 21A may include a gate dielectric layer for a low voltage. The gate electrode 21B may be a single-layered structure of a doped silicon or a stack structure of a doped silicon and a metal compound. The metal compound may include a metal silicide. The source S and the drain D may be formed as N type and P type impurity regions in the substrate 10 on both sides of the gate electrode 21B.

A first interlayer dielectric layer 24 which covers the peripheral transistors 21 is formed on a main surface 10A of the substrate 10, and first metal lines 22 may be disposed on the first interlayer dielectric layer 24.

In the following descriptions for the sake of convenience of description, an XYZ orthogonal coordinate system will be used. In the coordinate system, every direction is orthogonal to each other. A plane which is parallel to the main surface 10A of the substrate 10 is defined as an X direction and a Y direction. The direction which is orthogonal to both of the X direction and the Y direction, that is, a stack direction of respective layers, is defined as a Z direction.

In the first interlayer dielectric layer 24, first contact plugs 27, which pass throng the first interlayer dielectric layer 24 in the Z direction and are respectively coupled to gate electrodes 21B, sources S and drains D of the peripheral transistors 21, may be formed. Each of the first metal lines 22 may be a line type which extends in the X direction. The first metal lines 22 may be electrically coupled to the gate electrodes 21B, the sources S, and the drains D of the peripheral transistors 21 through the first contact plugs 27.

A second interlayer dielectric layer 25 may be formed on the first interlayer dielectric layer 24 to cover the first metal lines 22, and second metal lines 23 may be disposed on the second interlayer dielectric layer 25. Each of the second metal lines 23 may be a line type which extends in the Y direction. The second metal lines 23 may be electrically coupled to the first metal lines 22 through second contact plugs 28 which pass through the second interlayer dielectric layer 25 in the Z direction.

Any one of the source S and the drain D of at least one of the peripheral transistors 21 may be electrically coupled to a voltage source (not shown) which provides a common source voltage, through the first contact plug 27 and the first metal line 22. The other of the source S and the drain D of the peripheral transistor 21 may be electrically coupled to the second metal line 23 through the first contact plug 27, the first metal line 22 and the second contact plug 28. That is to say, the second metal lines 23 may be electrically coupled to the voltage source, which provides the common source voltage, through the peripheral transistors 21. The second metal lines 23 may transfer the common source voltage provided from the voltage source, according to on/off states of the peripheral transistors 21.

A third interlayer dielectric layer 26 may be formed on the second interlayer dielectric layer 25 to cover the second metal lines 23, and the top surface of the third interlayer dielectric layer 26 may be planarized.

The pipe gate electrode layer 30 may be formed on the third interlayer dielectric layer 26 of the circuit layer 20 and may be a conductive material such as a doped polysilicon layer.

The conductive layers 40 are stacked alternately with interlayer dielectric layers (not shown) on the pipe gate electrode layer 30. At least one uppermost conductive layer 40 among the conductive layers 40 may be select lines, and the remaining conductive layers 40 may be word lines.

Referring to FIGS, 1 and 2, the source lines SL are formed on the uppermost conductive line 40 to traverse memory blocks MB1 and MB2. In the present embodiment, the memory blocks MB1 and MB2 are arranged in the Y direction. The source lines SL extend in the X direction and traverse the memory blocks MB1 and MB2 at positions separated from a boundary region BR between the memory blocks MB1 and MB2, The first slits SLT1 pass through the pipe gate electrode layer 30 in the Z direction at positions overlapping with the source lines SL, that is positions separated from the boundary region BR, and divide the pipe gate electrode layer 30 into the plurality of pipe gate electrodes PCG. Each pipe gate electrode PCG is disposed over adjacent 2 memory blocks MB1 and MB2 and the boundary region BR between them, and is separated from another adjacent pipe gate electrode PCG by the first slit SLT1 in each of the memory blocks MB1 and MB2.

A first dielectric layer 32, such as a high temperature oxidation (HTO) oxide layer, a high density plasma (HDP) oxide layer, an spin-on-dielectric (SOD) oxide layer, and a polysilazane (PSZ) oxide layer, may be filled in the first slits SLT1.

Referring to FIGS. 1 and 3, the second slits SLT2 pass through the conductive layers 40 in the Z direction, are located over the boundary regions BR between memory blocks MB1 and MB2, that is, are located at positions separated from the first slits SLT1, and divide the conductive layers 40 by the unit of memory block. The bottom ends of the second slits SLT2 are coupled with the pipe gate electrodes PCG which are disposed at the boundary regions BR between the memory blocks MB1 and MB2. A dielectric layer (not shown) such as a HTO oxide layer, a HDP oxide layer, a SOD oxide layer, and a PSZ oxide layer may be filled in the second slits SLT2.

At least one pipe channel layer PC may be formed in each pipe gate electrode PCG, and a pair of vertical channel layers SP1 and SP2 may be formed on the pipe channel layer PC. The pair of vertical channel layers SP1 and SP2 pass through the conductive layers 40 in the Z direction. Bottom ends of the pair of vertical channel layers SP1 and SP2 are coupled to the pipe channel layer PC. Each of the pipe channel layer PC and the vertical channel layers SP1 and SP2 may be formed of a polysilicon layer which is not doped with an impurity. Between the pair of vertical channel layers SP1 and SP2, the top end of the first vertical channel layer SP1 may be coupled with the source line SL, and the top end of the second vertical channel layer SP2 may be coupled with a bit line BL.

In the present embodiment, each of the pipe channel layer PC and the vertical channel layers SP1 and SP2 has a pillar structure which is completely filled. However, it is to be noted that the embodiment is not limited thereto. Each of the pipe channel layer PC and the vertical channel layers SP1 and SP2 may have a tube shape. A center region of each of the pipe channel layer PC and the vertical channel layers SP1 and SP2 is open. In this case, a dielectric layer may be filled in the center region which is open.

While not shown, a memory layer (not shown) is formed on the surfaces of the vertical channel layers SP1 and SP2 and the pipe channel layer PC. The memory layer may include a tunnel dielectric layer, a charge storage layer, and a charge blocking layer, or may include at least one of them. The charge storage layer may include at least one of a floating gate, such as a polysilicon layer, which stores charges, a trap layer, such as a nitride layer, which traps charges, and a nano-dot. The memory layer may include a phase change material in place of the charge storage layer. An additional memory layer which is interposed between the memory layer and the conductive layers 40 and covers the top and bottom surfaces of the conductive layers 40 may be further included. The additional memory layer may include a tunnel dielectric layer, a charge storage layer, and a charge blocking layer, or may include at least one of them. The charge blocking layer of the additional memory layer may be a stack layer of an oxide layer and a high-k material layer.

At least the uppermost one of the conductive layers 40 which surrounds the first vertical channel layer SP1 becomes a source select line, and conductive layers 40 under the source select line become word lines. Further, at least the uppermost one of the conductive layers 40 which surrounds the second vertical channel layer SP2 becomes a drain select line, and conductive layers 40 under the drain select line become word lines.

A source select transistor is formed where the source select line surrounds the first vertical channel layer SP1, memory cells are formed where the word lines respectively surround the first and second vertical channel layers SP1 and SP2, and a drain select transistor is formed where the drain select line surrounds the second vertical channel layer SP2. A pipe coupling transistor is formed where the pipe gate electrode PCG surrounds the pipe channel layer PC. By the above-described structure, a memory cell string is formed. The memory cell string includes a U-shaped channel layer having the pipe channel layer PC and the first and second vertical channel layers SP1 and SP2, and the drain select transistor, the memory cells, the pipe coupling transistor and the source select transistor formed along the U-shaped channel layer.

Third slits SLT3, which pass through the conductive layers 40 in the Z direction and divide the conductive layers 40, may be formed between first and second vertical channel layers SP1 and SP2. A dielectric layer not shown) such as an HTO oxide layer, an HOP oxide layer, an SOD oxide layer, and a PSZ oxide layer may be filled in the third slits SLT3.

Third contact plugs 71, which pass through the conductive layers 40 and the first dielectric layer 32 in the Z direction and couple the source lines SL and the second metal lines 23 of the circuit layer 20, may be formed under the source lines SL. The source lines SL may be electrically coupled with the second metal lines 23 of the circuit layer 20 through the third contact plugs 71, and may receive a common source voltage from the second metal lines 23. Dielectric spacers 70, which insulate the third contact plugs 71 and the conductive layers 40 from each other, may be formed on the sidewalls of the third contact plugs 71.

Figure 4:
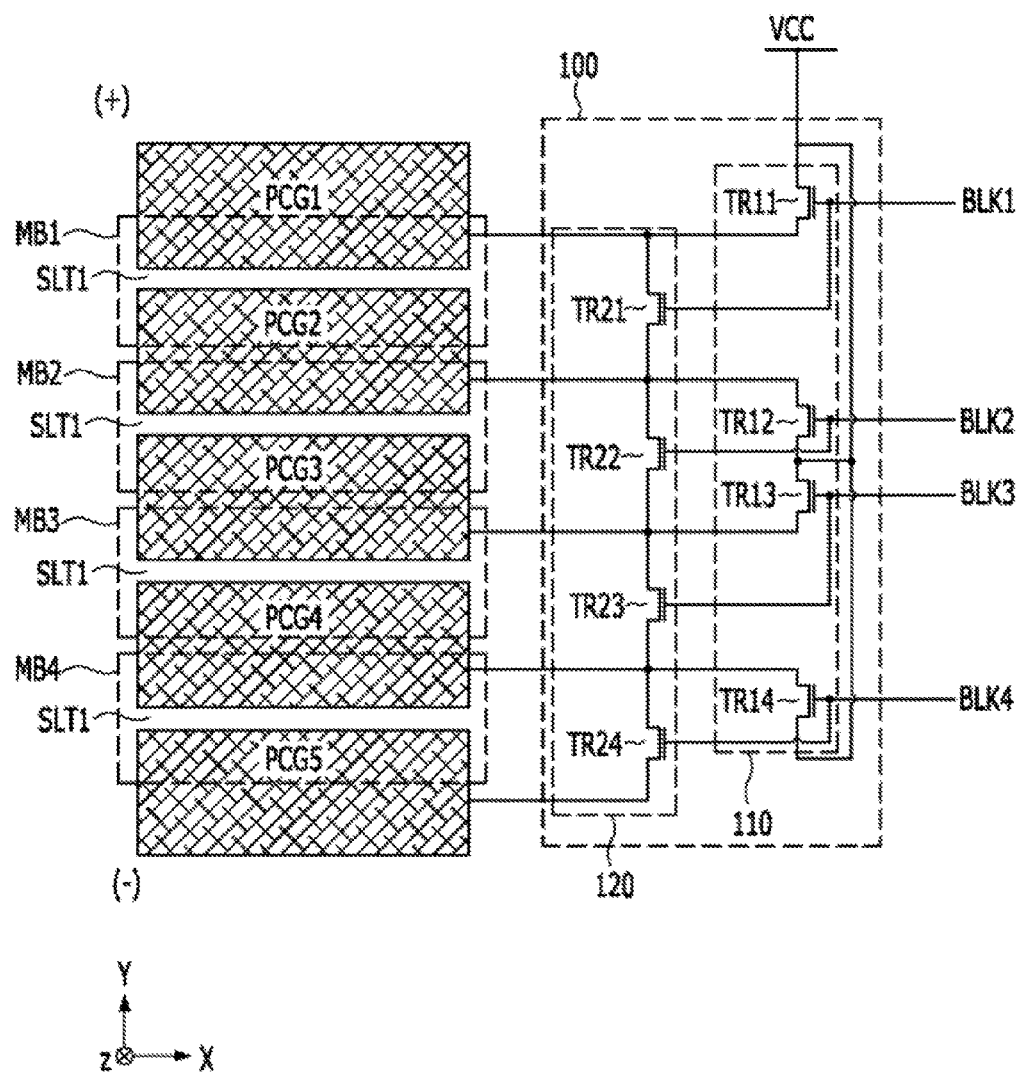
FIG. 4 is a diagram schematically illustrating a pass transistor unit included in a row decoder of a nonvolatile memory device in accordance with an embodiment.
Figure 5:
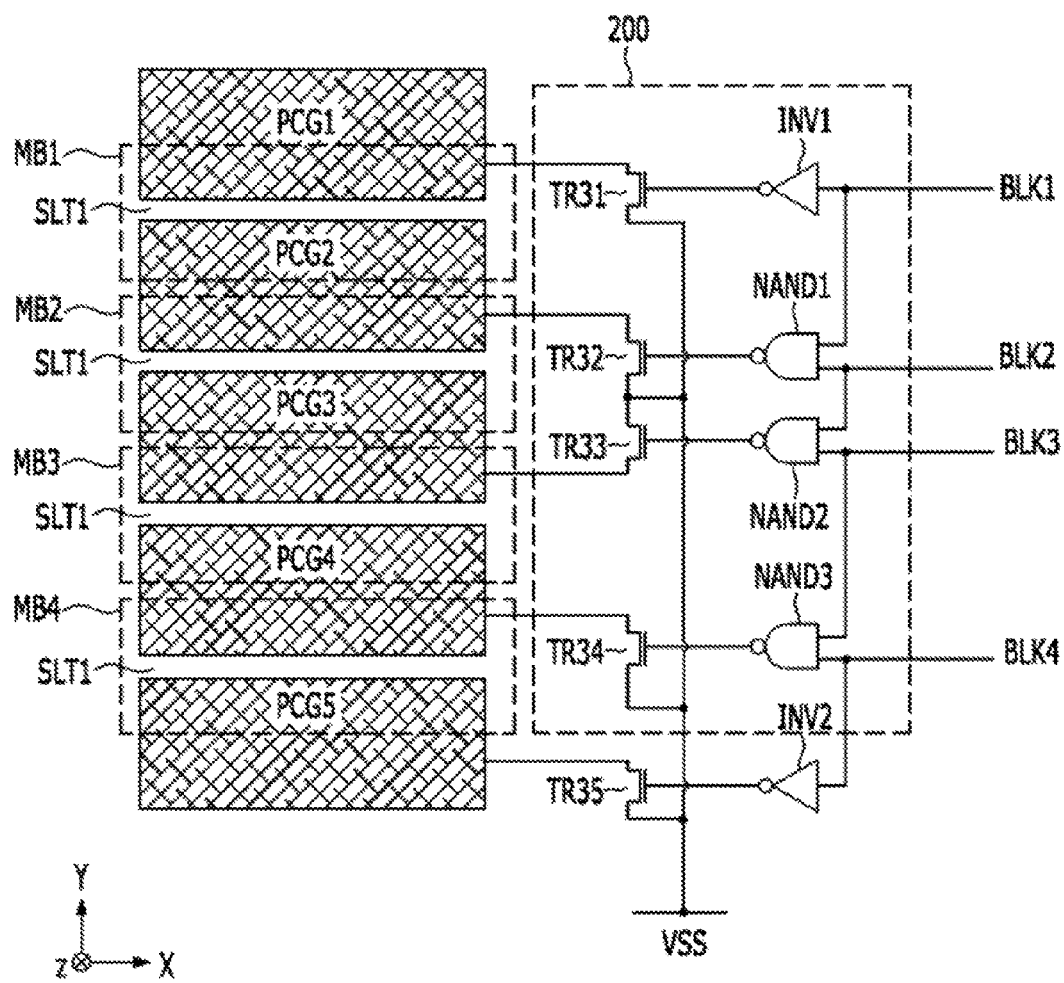
FIG. 5 is a diagram schematically illustrating a discharge transistor unit included in a row decoder of a nonvolatile memory device in accordance with an embodiment.

FIG. 4 is a diagram schematically illustrating a pass transistor unit included in a row decoder of a nonvolatile memory device in accordance with an embodiment, and FIG. 5 is a diagram schematically illustrating a discharge transistor unit included in a row decoder of a nonvolatile memory device in accordance with an embodiment. In FIGS. 4 and 5, a structure for driving 4 memory blocks MB1 to MB4 is illustrated as an example.

Referring to FIGS. 4 and 5, first to fourth memory blocks MB1 to MB4 are arranged in the Y direction. First and second pipe gate electrodes PCG1 and PCG2 which are divided by a first slit SLT1 extending in the X direction are disposed in the first memory block MB1, second and third pipe gate electrodes PCG2 and PCG3 which are divided by a first slit SLT1 extending in the X direction are disposed in the second memory block MB2, third and fourth pipe gate electrodes PCG3 and PCG4 which are divided by a first slit SLT1 extending in the X direction are disposed in the third memory block MB3, and fourth and fifth pipe gate electrodes PCG4 and PCG5 which are divided by a first slit SLT1 extending in the X direction are disposed in the fourth memory block MB4.

A portion of the first pipe gate electrode PCG1 is disposed in the first memory block MB1, the second pipe gate electrode PCG2 is disposed in the first and second memory blocks MB1 and MB2 disposed adjacent to each other and the boundary region between them, the third pipe gate electrode PCG3 is disposed in the second and third memory blocks MB2 and MB3 disposed adjacent to each other and the boundary region between them, and the fourth pipe gate electrode PCG4 is disposed in the third and fourth memory blocks MB3 and MB4 disposed adjacent to each other and the boundary region between them. A portion of the fifth pipe gate electrode PCG5 is disposed in the fourth memory block MB4.

The row decoder may select any one of the first to fourth memory blocks MB1 to MB4 in response to a row address. The row decoder may provide a high voltage to a pipe gate electrode of a selected memory block, and discharge pipe gate electrodes of unselected memory blocks to a ground level.

Referring to FIG. 4, in order to provide a high voltage VCC to a pipe gate electrode disposed in a selected memory block, the row decoder includes a pass transistor unit 100. The pass transistor unit 100 may include a first pass transistor section 110 and a second pass transistor section 120.

The first pass transistor section 110 includes first to fourth pass transistors TR11 to TR14 which respectively correspond to the first to fourth memory blocks MB1 to MB4. Each of the first to fourth pass transistors TR11 to TR14 is configured to be electrically coupled with a pipe gate electrode disposed in a corresponding memory block and transfers the high voltage VCC to the pipe gate electrode when the corresponding memory block is selected.

In detail, the first pass transistor TR11 corresponds to the first memory block MB1, is electrically coupled with the first pipe gate electrode PCG1, and transfers the high voltage VCC to the first pipe gate electrode PCG1 in response to a first block select signal BLK1 which is enabled in the case in which the first memory block MB1 is selected.

The second pass transistor TR12 corresponds to the second memory block MB2, is electrically coupled with the second pipe gate electrode PCG2, and transfers the high voltage VCC to the second pipe gate electrode PCG2 in response to a second block select signal BLK2 which is enabled in the case in which the second memory block MB2 is selected.

The third pass transistor TR13 corresponds to the third memory block MB3, is electrically coupled with the third pipe gate electrode PCG3, and transfers the high voltage VCC to the third pipe gate electrode PCG3 in response to a third block select signal BLK3 which is enabled in the case in which the third memory block MB3 is selected.

The fourth pass transistor TR14 corresponds to the fourth memory block MB4, is electrically coupled with the fourth pipe gate electrode PCG4, and transfers the high voltage VCC to the fourth pipe gate electrode PCG4 in response to a fourth block select signal BLK4 which is enabled in the case in which the fourth memory block MB4 is selected.

The second pass transistor section 120 includes fifth to eighth pass transistors TR21 to TR24 which respectively correspond to the first to fourth memory blocks MB1 to MB4. Each of the fifth to eighth pass transistors TR21 to TR24 is coupled between 2 pipe gate electrodes disposed in a corresponding memory block, electrically couples a pipe gate electrode disposed in the (+)Y direction with respect to a first slit SLT1 and a pipe gate electrode disposed in a (−)Y direction with respect to the first slit SLT1 in the case in which the corresponding memory block is selected, and transfers the high voltage VCC applied to the pipe gate electrode disposed in the (+)Y direction to the pipe gate electrode disposed in the (−)Y direction when the corresponding memory block is selected.

In detail, the fifth pass transistor TR21 corresponds to the first memory block MB1, and is coupled between the first and second pipe gate electrodes PCG1 and PCG2 which are disposed in the first memory to block MB1. The fifth pass transistor TR21 electrically couples the first pipe gate electrode PCG1 disposed in the (+)Y direction with respect to a first slit SLT1 and the second pipe gate electrode PCG2 disposed in the (−)Y direction with respect to the first slit SLT1 in response to the first block select signal BLK1 when the first memory block MB1 is selected, and transfers the high voltage VCC applied to the first pipe gate electrode PCG1 to the second pipe gate electrode PCG2 when the first memory block MB1 is selected.

The sixth pass transistor TR22 corresponds to the second memory block MB2, and is coupled between the second and third pipe gate electrodes PCG2 and PCG3 which are disposed in the second memory block MB2. The sixth pass transistor TR22 electrically couples the second pipe gate electrode PCG2 disposed in the (+)Y direction with respect to a first slit SLT1 and the third pipe gate electrode PCG3 disposed in the (−)Y direction with respect to the first slit SLT1 in response to the second block select signal BLK2 which is enabled when the second memory block MB2 is selected, and transfers the high voltage VCC applied to the second pipe gate electrode PCG2 to the third pipe gate electrode PCG3 when the second memory block MB2 is selected.

The seventh pass transistor TR23 corresponds to the third memory block MB3, and is coupled between the third and fourth pipe gate electrodes PCG3 and PCG4 which are disposed in the third memory block MB3. The seventh pass transistor TR23 electrically couples the third pipe gate electrode PCG3, which is disposed in the (+)Y direction with respect to a first slit SLT1, and the fourth pipe gate electrode PCG4, which is disposed in the (−)Y direction with respect to the first slit SLT1, in response to the third block select signal BLK3 which is enabled when the third memory block MB3 is selected, and transfers the high voltage VCC applied to the third pipe gate electrode PCG3 to the fourth pipe gate electrode PCG4 when the third memory block MB3 is selected.

The eighth pass transistor TR24 corresponds to the fourth memory block MB4, and is coupled between the fourth and fifth pipe gate electrodes PCG4 and PCG5 which are disposed in the fourth memory block MB4. The eighth pass transistor TR24 electrically couples the fourth pipe gate electrode PCG4, which is disposed in the (+)Y direction with respect to a first slit SLT1, and the fifth pipe gate electrode PCG5, which is disposed in the (−)Y direction with respect to the first slit SLT1 in response to the fourth block select signal BLK4 which is enabled when the fourth memory block MB4 is selected, and transfers the high voltage VCC applied to the fourth pipe gate electrode PCG4 to the fifth pipe gate electrode PCG5 when the fourth memory block MB4 is selected.

Referring to FIG. 5, in order to discharge pipe gate electrodes of unselected memory blocks to the ground level, the row decoder includes a discharge transistor unit 200. The discharge transistor unit 200 may include first to fifth discharge transistors TR31 to TR35, first and second inverters INV1 and INV2, and first to third NAND gates NAND1 to NAND3.

The first inverter INV1 inverts the first block select signal BLK1. The first discharge transistor TR31 corresponds to the first pipe gate electrode PCG1, is coupled to the first pipe gate electrode PCG1, and transfers a ground voltage VSS to the first pipe gate electrode PCG1 in response to an inverted signal of the first block select signal BLK1 which is generated by the first inverter INV1.

The first NAND gate NAND1 performs NANDs operation on the first block select signal BLK1 and the second block select signal BLK2. The second discharge transistor TR32 corresponds to the second pipe gate electrode PCG2, is coupled to the second pipe gate electrode PCG2, and transfers the ground voltage VSS to the second pipe gate electrode PCG2 in response to the output signal of the first NAND gate NAND1.

The second NAND gate NAND performs NANDs operations on the second block select signal BLK2 and the third block select signal BLK3. The third discharge transistor TR33 corresponds to the third pipe gate electrode PCG3, is coupled to the third pipe gate electrode PCG3, and transfers the ground voltage VSS to the third pipe gate electrode PCG3 in response to the output signal of the second NAND gate NAND2.

The third NAND gate NAND performs NANDs operations on the third block select signal BLK3 and the fourth block select signal BLK4. The fourth discharge transistor TR34 corresponds to the fourth pipe gate electrode PCG4, is coupled to the fourth pipe gate electrode PCG4, and transfers the ground voltage VSS to the fourth pipe gate electrode PCG4 in response to the output signal of the third NAND gate NAND3.

The second inverter INV2 inverts the fourth block select signal BLK4. The fifth discharge transistor TR35 corresponds to the fifth pipe gate electrode PCG5, is coupled to the fifth pipe gate electrode PCG5, and transfers the ground voltage VSS to the fifth pipe gate electrode PCG5 in response to an inverted signal of the fourth block select signal BLK4 which is generated by the second inverter INV2.

Hereafter, a method for manufacturing a nonvolatile memory device in accordance with an embodiment will be described.

Figure 6:
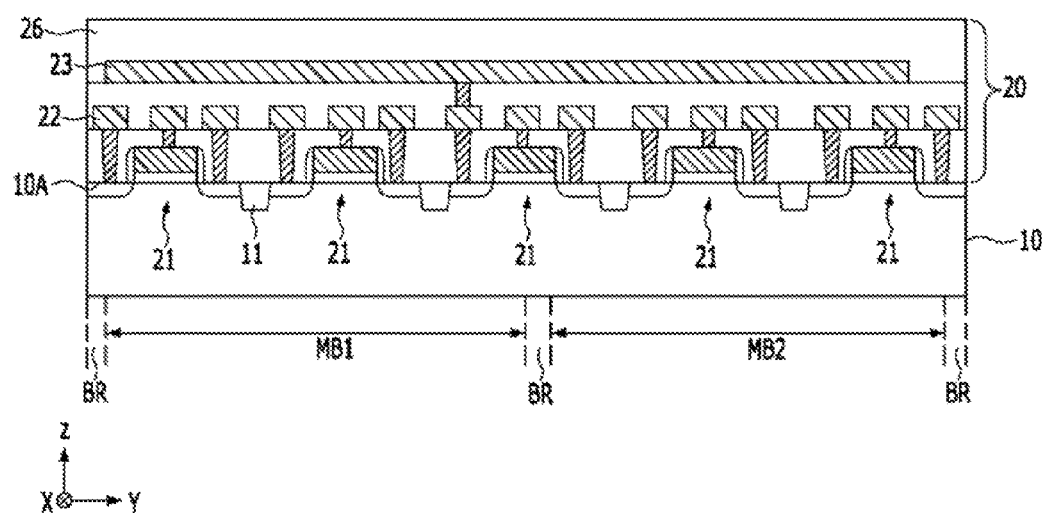
FIGS. 6 to 15 are cross-sectional views illustrating a method for manufacturing a nonvolatile memory device in accordance with an embodiment.

FIGS. 6 to 15 are cross-sectional views illustrating a method for manufacturing a nonvolatile memory device in accordance with an embodiment. Referring to FIG. 6, a substrate 10 is prepared. The substrate 10 includes a circuit layer 20 and is formed on a main surface 10A.

The substrate 10 may be a silicon substrate, a germanium substrate, a silicon-germanium substrate, a silicon-on-insulator (SOI) substrate, or a silicon-germanium-on-insulator (SGOI) substrate, and may include a predetermined structure such as an isolation layer 11 which defines active regions.

The circuit layer 20 may be formed on the main surface 10A of the substrate 10, and include a peripheral circuit for driving memory cells and metal lines 22 and 23. The peripheral circuit may be an integrated circuit in which individual elements such as peripheral transistors 21, resistors, capacitors and fuses are electrically coupled with one another.

At least one of the peripheral transistors 21 may be electrically coupled to a voltage source (not shown) which provides a common source voltage, and the metal lines 23 may be electrically coupled to the voltage source, which provides the common source voltage, through the peripheral transistor 21. An interlayer dielectric layer 26 may be formed on the top of the circuit layer 20, and the top surface of the interlayer dielectric layer 26 may be planarized through a planarization process.

Figure 7:
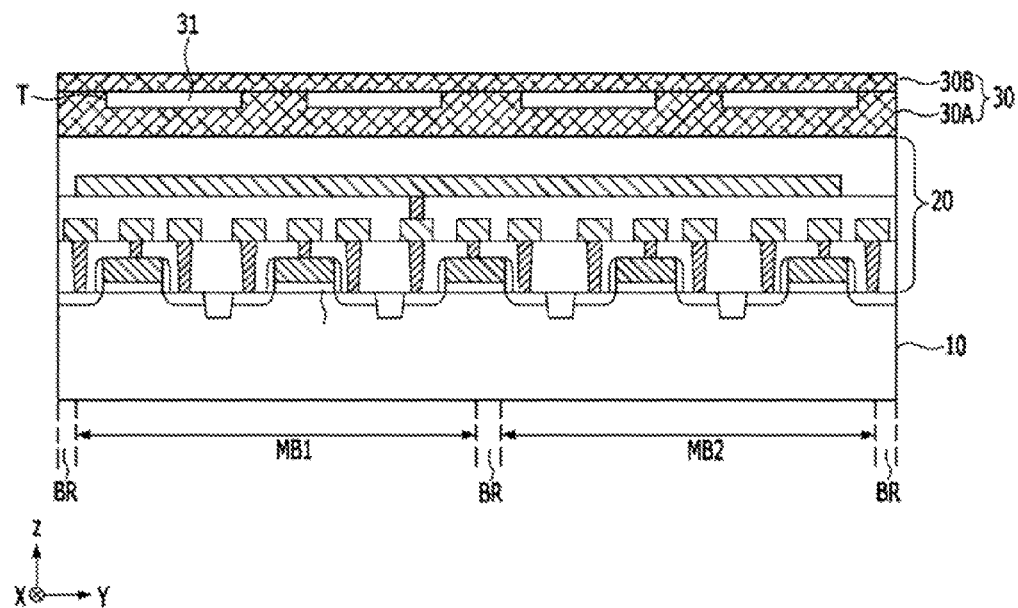

Referring to FIG. 7, a first pipe gate electrode layer 30A is formed on the circuit layer 20, and trenches T are formed in the first pipe gate electrode layer 30A. The first pipe gate electrode layer 30A may be a polysilicon layer which is doped with an impurity. For example, the first pipe gate electrode layer 30A may be a polysilicon layer which is doped with an N-type or P-type impurity. The trenches T define regions where a pipe channel layer is formed. A plurality of trenches T may be formed for each of memory blocks MB1 and MB2.

Sacrificial layer patterns 31 are formed in the trenches T. The sacrificial layer patterns 31 may be formed of a material which has an etching selectivity with respect to a first material layer, which will be formed subsequently. For example, the sacrificial layer patterns 31 may be formed of a silicon nitride (SiN) or a titanium nitride (TIN).

A second pipe gate electrode layer 30B is formed on the sacrificial layer patterns 31 and the first pipe gate electrode layer 30A. The second pipe gate electrode layer 30B may be formed of the same material as the first pipe gate electrode layer 30A. As a result, a pipe gate electrode layer 30, in which the first pipe gate electrode layer 30A and the second pipe gate electrode layer 30B are stacked, is formed.

Figure 8:
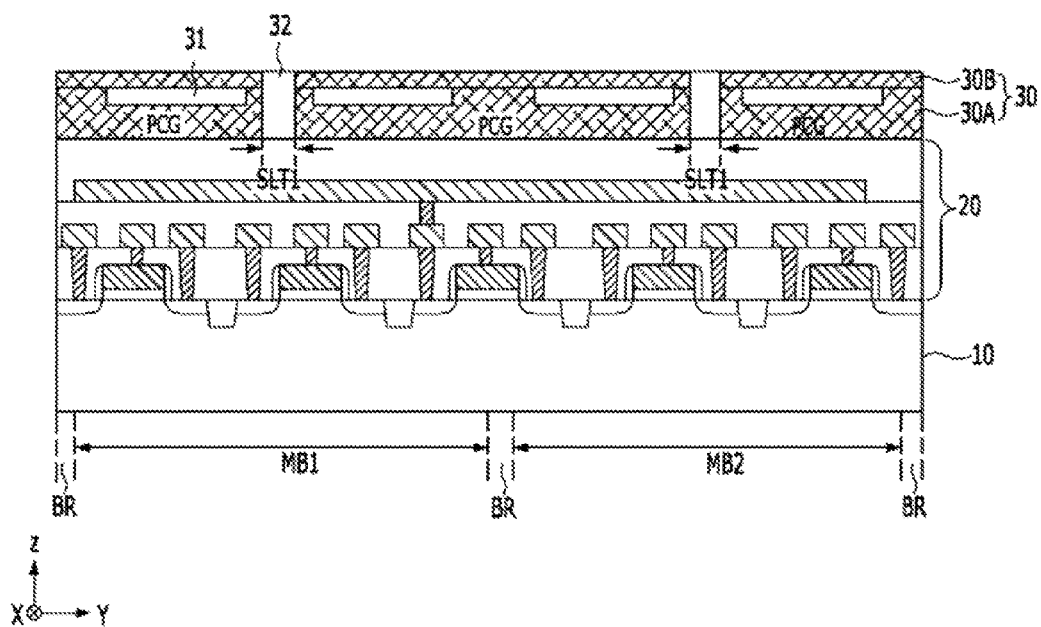

Referring to FIG. 8, by etching the pipe gate electrode layer 30 in a Z direction, a plurality of first slits SLT1, which divide the pipe gate electrode layer 30 into a plurality of pipe coupling gates PCG, are formed. The first slits SLT1 may extend in an X direction and traverse the respective memory blocks MB1 and MB2 at positions overlapping with source lines which are formed later.

Each pipe gate electrode PCG is disposed over adjacent 2 memory blocks MB1 and MB2 and a boundary region BR between them, and is isolated from another adjacent pipe gate electrode PCG by the first slit SLT1. The first slit SLT1 is formed in each of the memory blocks MB1 and MB2.

A first dielectric layer 32 is formed in the first slits SLT1. The first dielectric layer 32 may be, for example, an oxide layer which is formed using a HTO or a HDP process or an oxide layer such as SOD and PSZ.

Figure 9:
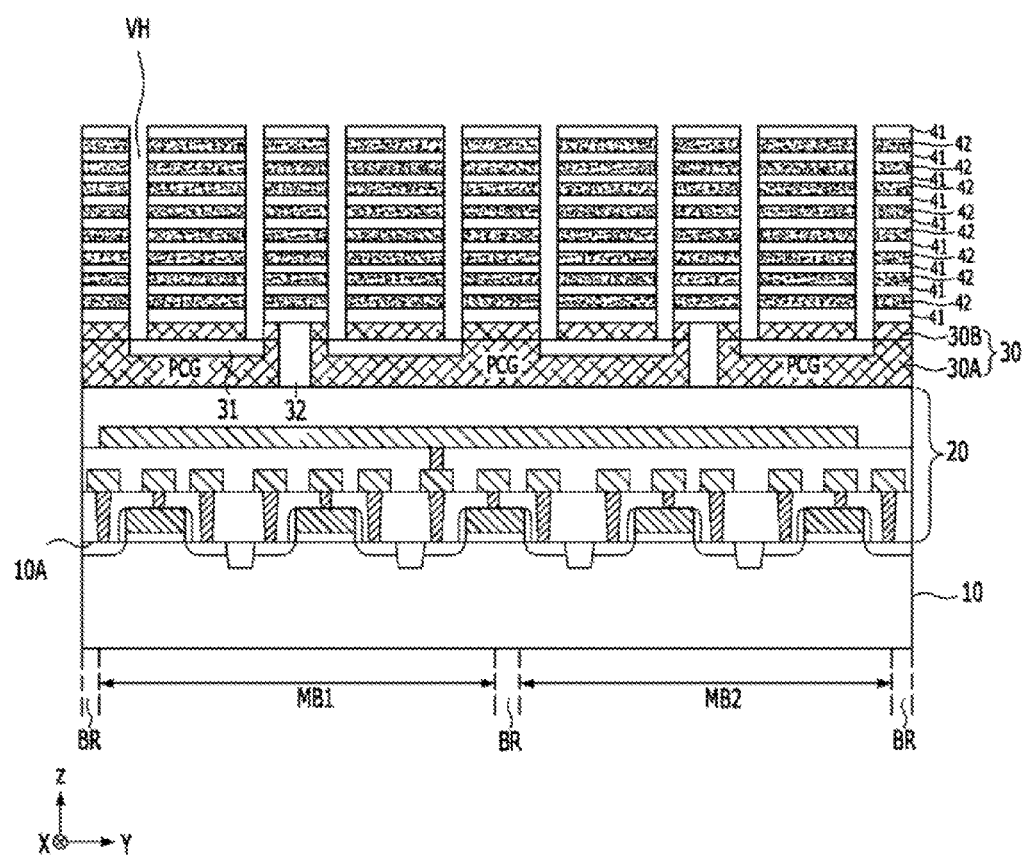

Referring to FIG. 9, a plurality of first material layers 41 and a plurality of second material layers 42 are alternately stacked on the pipe coupling gates PCG and the first dielectric layer 32.

The first material layers 41 may be interlayer dielectric layers, and the second material layers 42 may be sacrificial layers. The sacrificial layers are removed in a subsequent process and provide spaces in which select lines and word lines are formed. For example, the first material layers 41 may be formed of an oxide-based material, and the second material layers 42 may be formed of a material which has an etching selectivity with respect to the first material layers 41, for example, a nitride-based material. However, the present disclosure is not limited thereto.

In another embodiment, the first material layers 41 may be interlayer dielectric layers, and the second material layers 42 may be conductive layers for select lines and word lines. In this case, the first material layers 41 may be formed of dielectric layers such as oxide layers, and the second material layers 42 may be formed of conductive layers such as polysilicon layers. As another example, the first material layers 41 may be formed of dielectric layers by using an undoped polysilicon, an undoped amorphous silicon, or the like, and the second material layers 42 may be formed of conductive layers by using a doped polysilicon, a doped amorphous silicon, or the like. In the present embodiment, it will be described that the first material layers 41 are formed of interlayer dielectric layers and the second material layers 42 are formed of sacrificial layers.

The lowermost layer and the uppermost layer of the structure of the stack of the first material layers 41 and the second material layers 42 may be the first material layers 41. While the stack shown in FIG. 9 includes eight first material layers 41 and seven second material layers 42, this configuration is an example, and it should be noted that the number of first material layers 41 and second material layers 42 may be larger or smaller than the umber of layers shown in FIG. 9.

By etching the first and second material layers 41 and 42 and the second pipe gate electrode layer 30B, vertical channel holes VH are formed. The vertical channel holes VH pass through the first and second material layers 41 and 42 and the second pipe gate electrode layer 30B in the Z direction and expose the sacrificial layer patterns 31. The vertical channel holes VH may have a circular or oval shape when viewed on the top of the main surface 10A of the substrate 10. A pair of vertical channel holes VH may be disposed for each sacrificial layer pattern 31.

Figure 10:
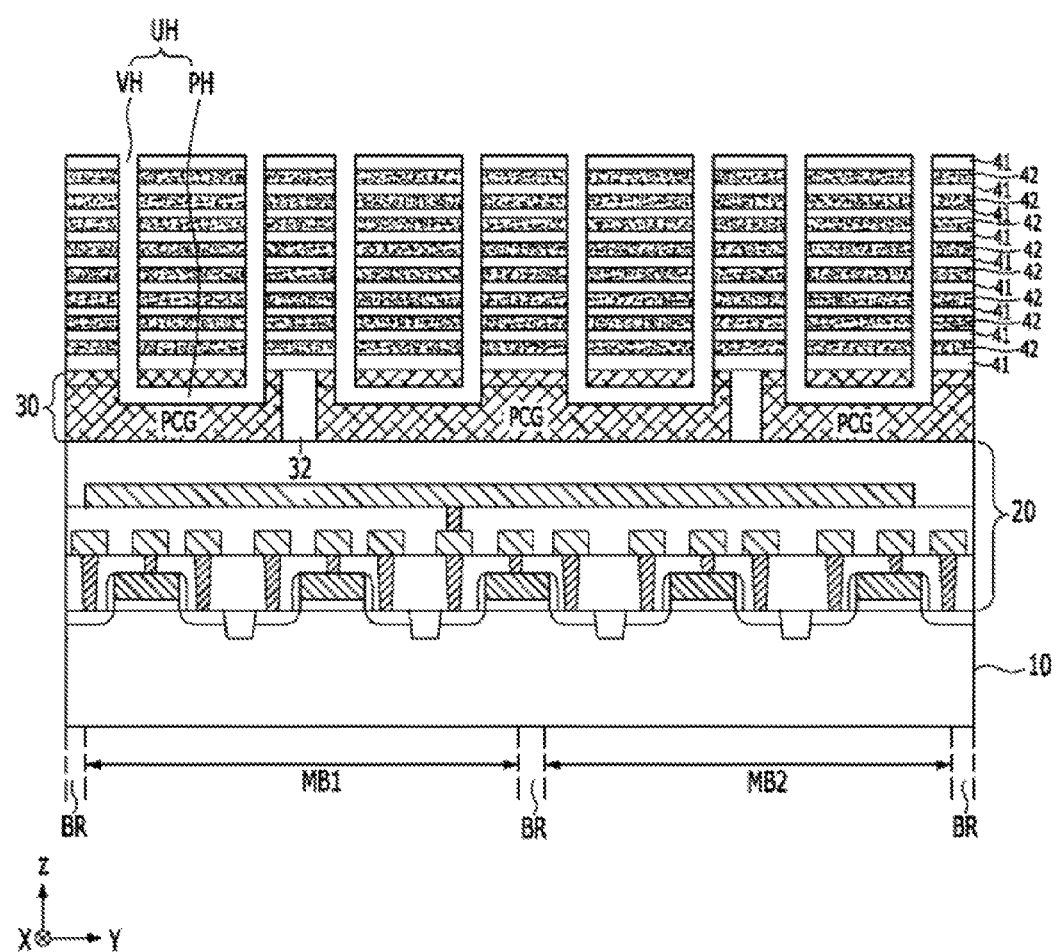

Referring to FIG. 10, by removing the sacrificial layer patterns 31, pipe channel holes PH are formed. Each of the pipe channel holes PH couples a pair of vertical channel holes VH. Thus, one continuous U-shaped hole UH is coupled to a pair of vertical channel holes VH.

Figure 11:
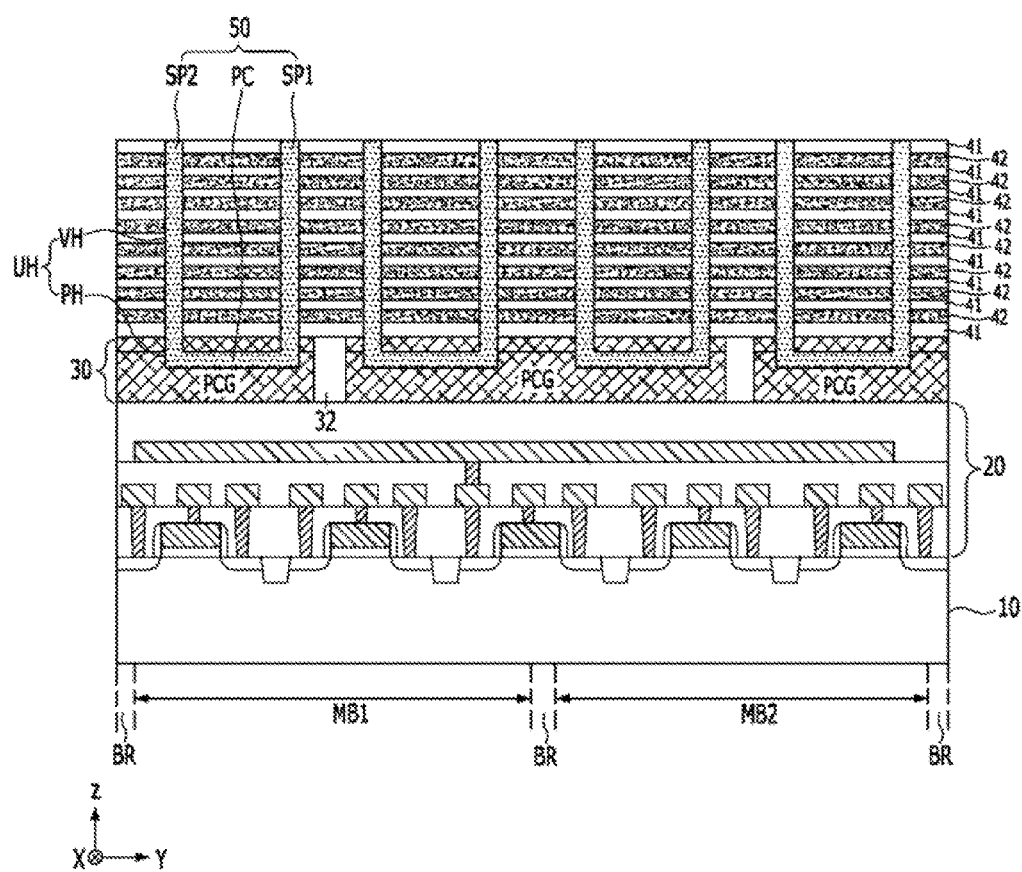

Referring to FIG. 11, a memory layer (not shown) is formed on Is the internal walls of U-shaped holes UH, and a channel layer 50 is formed on the memory layer. The memory layer may include a tunnel dielectric layer, a charge storage layer, and a charge blocking layer, or may include at least one of them. The charge storage layer may include at least one of a floating gate, such as a polysilicon layer, which stores charges, a trap layer, such as a nitride layer, which traps charges, and a nano-dot. The memory layer may include a phase change material in place of the charge storage layer.

The channel layer 50 may be foamed of, for example, an undoped polysilicon layer which is not doped with an impurity. The channel layer 50 may be divided into a pipe channel layer PC which is formed in the pipe channel holes PH and vertical channel layers SP1 and SP2 which are formed in the vertical channel holes VH. The vertical channel layers SP1 and SP2 may be used as channels of memory cells or select transistors, and the pipe channel layer PC may be used as channels of pipe coupling transistors. In an embodiment, the channel layer 50 is formed to a thickness that completely fills the vertical channel holes VH and the pipe channel holes PH. However, the present disclosure is not limited thereto. In another embodiment, the channel layer 50 may be formed to a thin thickness that does not completely fill the vertical channel holes VH and the pipe channel holes PH.

Figure 12:
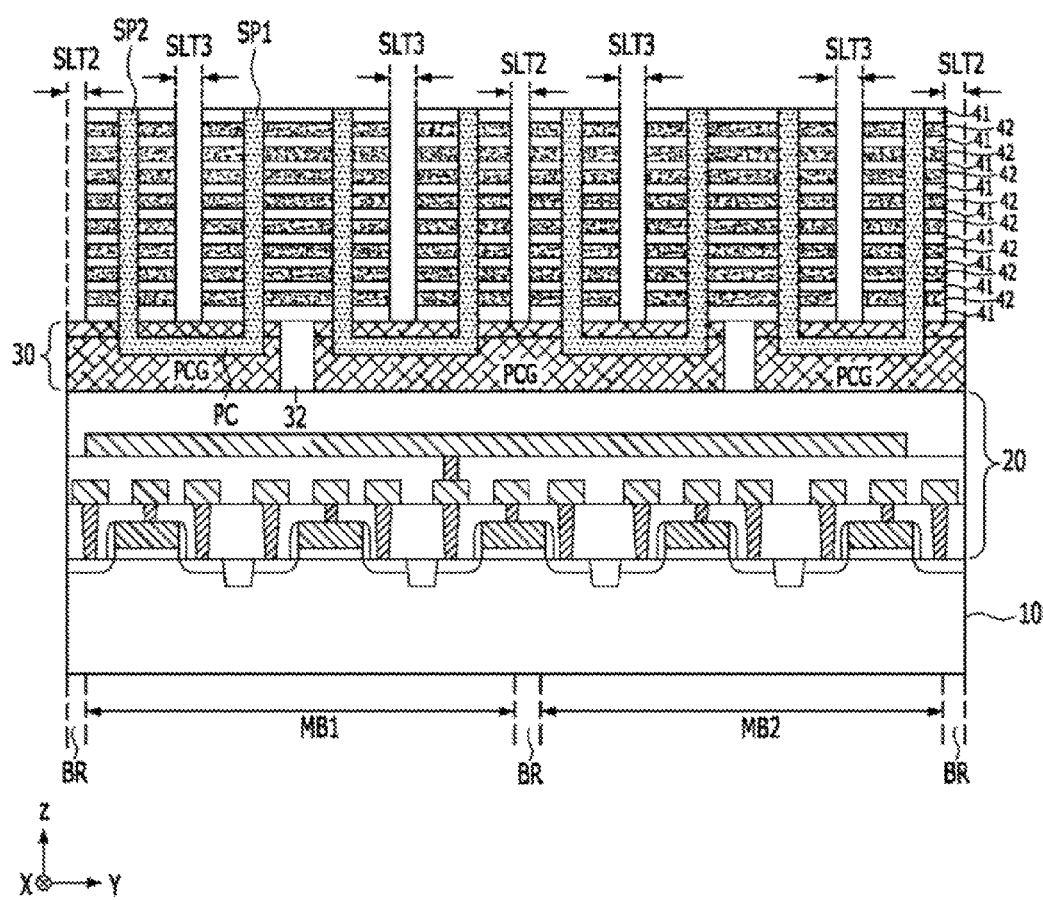

Referring to FIG. 12, by etching the first and second material layers 41 and 42 using the pipe gate electrodes PCG as an etch stop layer, second slits SLT2 are formed. The second slits SLT2 pass through the first and second material layers 41 and 42 in the Z direction, are located at positions which are separated from the first slits SLT1, and divide the first and second material layers 41 and 42 into a plurality of memory blocks. Since etching is performed by using the pipe gate electrodes PCG formed at the boundary regions BR between memory blocks like the memory blocks MB1 and MB2 as an etch stop layer, etching stops at the pipe gate electrodes PCG. Accordingly, it is possible to substantially prevent the circuit layer 20 under the pipe gate electrodes PCG from being damaged.

During an etching process for forming the second slits SLT2, by etching the first and second material layers 41 and 42 between the first and second vertical channel layers SP1 and SP2, which are coupled to each, other by the pipe channel layer PC, third slits SLT3 are formed. The third slits SLT3 pass through the first and second material layers 41 and 42 in the Z direction and divide the first and second material layers 41 and 42.

Figure 13:
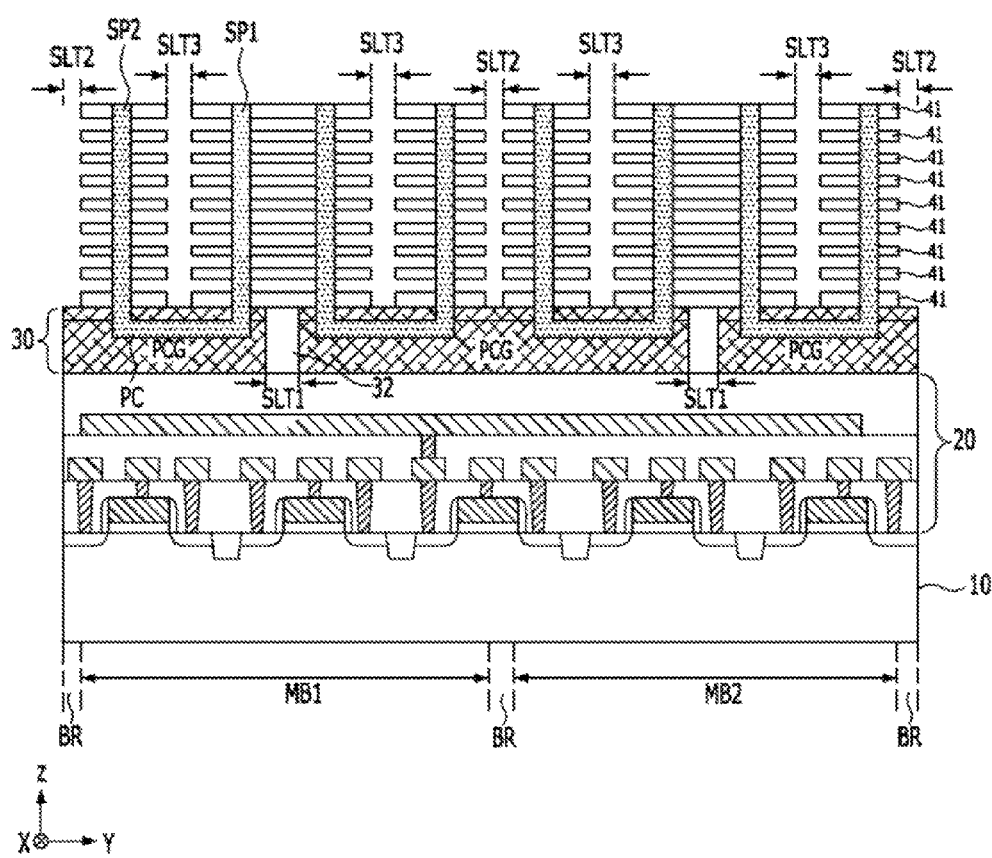

Referring to FIG. 13, the second material layers 42 which are exposed by forming the second and third slits SLT2 and SLT3 are removed. In order to remove the second material layers 42, a wet etching process using an etching selectivity with respect to the first material layers 41 may be performed.

Figure 14:
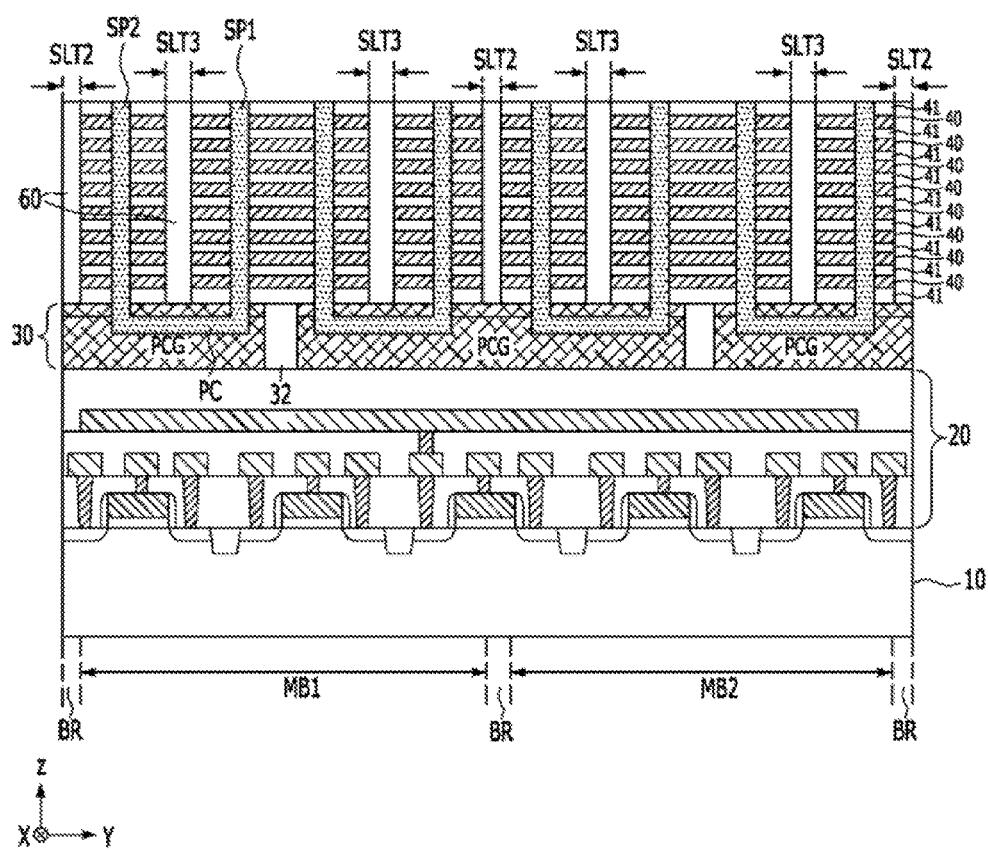

Referring to FIG. 14, conductive layers 40 are formed in spaces from which the second material layers 42 are removed. A second dielectric layer 60 is formed to fill the second and third slits SLT2 and SLT3.

The second dielectric layer 60 may be an oxide layer which is formed using a HTO or HDP process or an oxide layer such as SOD and PSZ. At least one uppermost conductive layer 40 among the conductive layers 40 may be select lines, and the remaining conductive layers 40 may be word lines. The conductive layers 40 may be formed of a doped polysilicon, a doped amorphous silicon, or the like.

Figure 15:
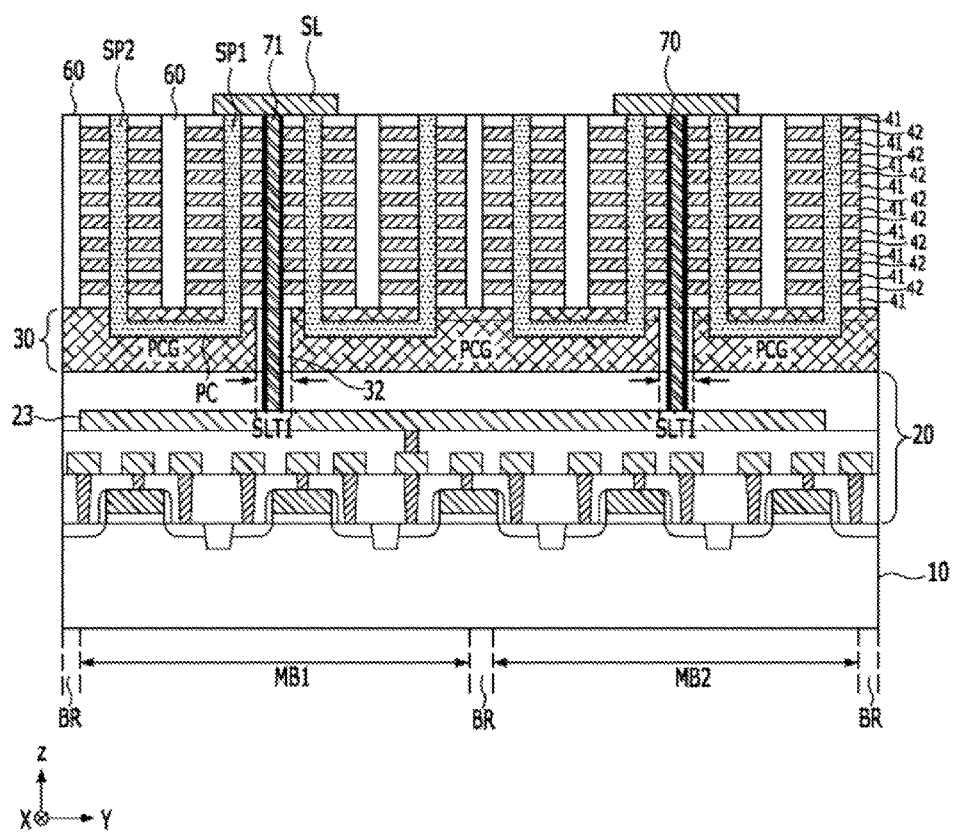

Referring to FIG. 15, contact holes, which pass through the first material layers 41, the conductive layers 40 and the first dielectric layer 32 in the Z direction and expose the metal lines 23 of the circuit layer 20, are formed. Dielectric spacers 70 are formed on the sidewalls of the contact holes. By filling a conductive layer in the contact holes, contact plugs 71 are formed. The contact plugs 71 are coupled with the metal lines 23.

Source lines SL, which are coupled with the first vertical channel layers SP1 and the contact plugs 71 and are of a line type extending in the X direction, are formed on the structure in which the first material layers 41 and the conductive layers 40 are alternately stacked.

Thereafter, while not shown, an interlayer dielectric layer is formed on the uppermost first material layer 41 to cover the source lines SL. Contact plugs are formed to be coupled with the second vertical channel layers SP2. Bit lines are formed on the interlayer dielectric layer to be coupled with the contact plugs.

Figure 16:
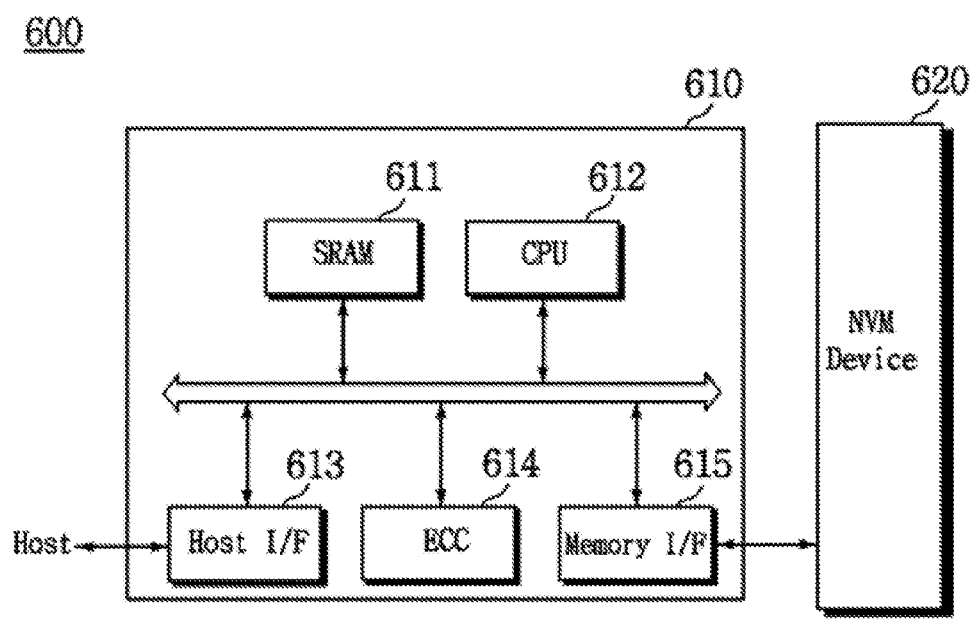
FIG. 16 is a block diagram schematically illustrating a memory system including a nonvolatile memory device in accordance with an embodiment.

FIG. 16 is a block diagram schematically illustrating a memory system including a nonvolatile memory device in accordance with an embodiment. Referring to FIG. 16, a memory system 600 in accordance with an embodiment may include a nonvolatile memory device 620 and a memory controller 610.

The nonvolatile memory device 620 may include the aforementioned nonvolatile memory device. The memory controller 610 is configured to control the nonvolatile memory device 620. By the combination of the nonvolatile memory device 620 and the memory controller 610, a memory card or a solid state disk (SSD) may be provided. An SRAM 611 is used as the working memory of a central processing unit (CPU) 612. A host interface 613 includes a data exchange protocol of a host which is coupled with the memory system 600.

An error correction code (ECC) block 614 detects and corrects an error included in the data read out from the nonvolatile memory device 620. A memory interface 615 interfaces with the nonvolatile memory device 620. The CPU 612 performs general control operations for data exchange of the memory controller 610.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 620 may be provided as a multi-chip package which is constructed from a plurality of flash memory chips.

The memory system 600 in accordance with the embodiment, described above, may be provided as a storage medium of high reliability, which has a low probability of an error to occur. In particular, the aforementioned semiconductor memory device may be provided for a memory system such as a solid state disk (SSD) which is recently being actively studied. In this case, the memory controller 610 may be configured to communicate with an exterior for example, the host through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, and an ESDI (enhanced small disk interface) protocol and an IDE (Integrated Device Electronics) protocol.

Figure 17:
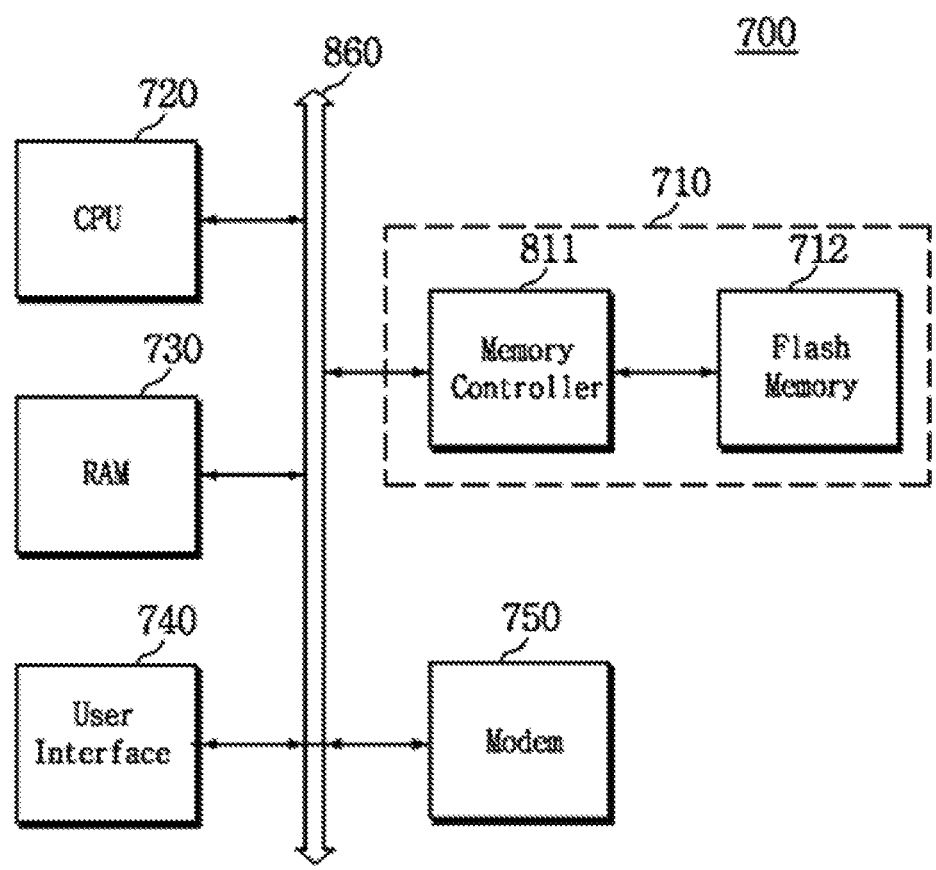
FIG. 17 is a block diagram schematically illustrating computing system including a nonvolatile memory device in accordance with an embodiment.

FIG. 17 is a block diagram schematically illustrating a computing system including a nonvolatile memory device in accordance with an embodiment. A computing system 700 in accordance with an embodiment may include a microprocessor 720, a RAM 730, a user interface 740, a modem 750 such as a baseband chipset, and a memory system 710, which are electrically coupled to a system bus 760.

In the case in which the computing system 700 in accordance with an embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may be, for example, an SSD (solid state drive/disk) which uses a nonvolatile memory to store data. Otherwise, the memory system 710 may be provided as a fusion flash memory for example, a OneNAND flash memory.

While various embodiments have been described above, it will be understood by those skilled in the art that the embodiments described are by way of example only. Accordingly, the nonvolatile memory device and the method for manufacturing the same described herein should not be limited based on the described embodiments.

What is claimed is:

1. A nonvolatile memory device comprising:
   a pipe gate electrode layer formed over a substrate;
   a plurality of conductive layers stacked over the pipe gate electrode layer;
   source lines formed over the plurality of conductive layers; and
   first slits passing through the pipe gate electrode layer to divide the pipe gate electrode layer into a plurality of pipe gate electrodes,
   wherein the first slits overlap with the source lines,
   wherein second slits pass through the conductive layers to divide the conductive layers into a plurality of memory blocks,
   wherein the second slits do not overlap with the first slits; and
   a circuit layer formed between the substrate and the pipe gate electrode layer,
   wherein the circuit layer comprises a peripheral circuit for driving memory cells included in the plurality of memory blocks.

2. The nonvolatile memory device according to claim 1,
   wherein the circuit layer comprises metal lines,
   wherein the metal lines are electrically coupled to a voltage source, and
   wherein the voltage source provides a common source voltage.

3. The nonvolatile memory device according to claim 2, further comprising:
   a first dielectric layer filled in the first slits; and
   contact plugs passing through the first dielectric layer and the conductive layers and electrically coupling the source lines to the metal lines.

4. The nonvolatile memory device according to claim 3, further comprising:
   dielectric spacers extending from between the contact plugs and the first dielectric layer to between the contact plugs and the conductive layers.

5. The nonvolatile memory device according to claim 1,
   wherein at least one uppermost conductive layer of the plurality of conductive layers becomes a select line, and the remaining conductive layers of the plurality of conductive layers become word lines.

6. The nonvolatile memory device according to claim 1, further comprising:
   at least one pipe channel layer formed in each pipe gate electrode;
   a first vertical channel layer passing through the conductive layers, formed over the pipe channel layer, and coupled to the source line; and
   a second vertical channel layer passing through the conductive layers, formed over the pipe channel layer, and coupled to a bit line.

7. The nonvolatile memory device according to claim 1,
   wherein each of the plurality of pipe gate electrodes is disposed between two adjacent memory blocks and over a boundary region between the two adjacent memory blocks, and
   wherein the plurality of pipe gate electrodes are isolated from each other by the first slits.

8. The nonvolatile memory device according to claim 7,
   wherein each of the first slits is configured to divide the pipe gate electrode layer into a first pipe gate electrode and a second pipe gate electrode in each of the memory blocks.

9. The nonvolatile memory device according to claim 8, further comprising:
   first pass transistors respectively corresponding to the plurality of memory blocks, wherein each of the first pass transistors is electrically coupled to first pipe gate electrodes, wherein each of the first pass transistors transfers a pipe gate voltage to the first pipe gate electrodes; and
   second pass transistors respectively corresponding to the plurality of memory blocks, wherein each of the second pass transistors is electrically coupled between the first and the second pipe gate electrodes, wherein each of the second pass transistors transfers the pipe gate voltage applied to the first pipe gate electrode to the second pipe gate electrode.

10. The nonvolatile memory device according to claim 7, further comprising:
    discharge transistors respectively corresponding to the plurality of pipe gate electrodes, wherein each of the discharge transistors is coupled to each of the plurality of pipe gate electrodes, wherein each of the discharge transistors transfers a ground voltage to each of the plurality of pipe gate electrodes.

11. A method for manufacturing a nonvolatile memory device, comprising:
    forming a pipe gate electrode layer over a substrate;
    etching the pipe gate electrode layer to form first slits which divide the pipe gate electrode layer into a plurality of pipe gate electrodes;
    forming a first dielectric layer filling the first slits;
    forming a stack by alternately stacking a plurality of first material layers and a plurality of second material layers over the pipe gate electrodes and the first dielectric layer;
    etching the first and second material layers by using the pipe gate electrodes as an etch stop layer to form second slits, wherein the second slits divide the stack into a plurality of memory blocks, wherein the second slits do not overlap with the first slits;
    forming a second dielectric layer filling the second slits; and
    forming source lines over the divided stack and over the second dielectric layer, wherein the source lines overlap with the first slits.

12. The method according to claim 11, wherein the forming of the pipe gate electrode layer comprises:
    forming a first pipe gate electrode layer over the substrate;
    forming trenches in the first pipe gate electrode layer;
    forming sacrificial layer patterns filling the trenches; and
    forming a second pipe gate electrode layer over the first pipe gate electrode layer.

13. The method according to claim 12, further comprising:
    after the forming of the stack and before the forming of the second slits,
    etching the first and second material layers and the second pipe gate electrode layer to form vertical channel holes so that the vertical channel holes expose the sacrificial layer patterns;
    removing the sacrificial layer patterns to form pipe channel holes so that the pipe channel holes communicate with the vertical channel holes;
    forming a memory layer over internal surfaces of the pipe channel holes and the vertical channel holes; and
    forming a channel layer over the memory layer.

14. The method according to claim 11,
wherein the first material layers comprise interlayer dielectric layers, and the second material layers comprise sacrificial layers.

15. The method according to claim 14, further comprising:
after the forming of the second slits and before the forming of the source lines,
removing the second material layers which are exposed by the second slits; and
forming conductive layers in spaces which are created by removing the second material layers.

16. The method according to claim 11,
wherein the first material layers comprise interlayer dielectric layers, and
wherein the second material layers comprise conductive layers.

17. The method according to claim 11, further comprising:
before the forming of the pipe gate electrode layer, forming a circuit layer over the substrate.

18. The method according to claim 17,
wherein the circuit layer comprises a peripheral circuit for driving memory cells of the plurality of memory blocks.

19. The method according to claim 17,
wherein the circuit layer comprises metal lines electrically coupled to a voltage source, and
wherein the voltage source provides a common source voltage.

20. The method according to claim 19, further comprising:
after the forming of the second slits and before the forming of the source lines,
removing the second material layers which are exposed by the second slits;
forming conductive layers in spaces which are created by removing the second material layers;
forming contact holes passing through the first material layers, the conductive layers, and the first dielectric layer under the source lines and exposing the metal lines of the circuit layer; and
forming contact plugs in the contact holes,
wherein the contact holes are coupled to the metal lines.

21. The method according to claim 20, further comprising:
after the forming of the contact holes and before the forming of the contact plugs,
forming dielectric spacers over sidewalls of the contact holes.

* * * * *